US010446708B2

(12) United States Patent
Hsiao et al.

(10) Patent No.: US 10,446,708 B2
(45) Date of Patent: Oct. 15, 2019

(54) OPTOCOUPLER DEVICE AND FRAME MODULE THEREOF

(71) Applicant: ANPEC ELECTRONICS CORPORATION, Hsinchu (TW)

(72) Inventors: Chien-Chung Hsiao, Taoyuan (TW); Chih-Cheng Chien, New Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 191 days.

(21) Appl. No.: 15/784,923

(22) Filed: Oct. 16, 2017

(65) Prior Publication Data

US 2019/0035966 A1 Jan. 31, 2019

(30) Foreign Application Priority Data

Jul. 26, 2017 (TW) .............................. 106125115 A

(51) Int. Cl.

| H01L 31/147 | (2006.01) |
|---|---|
| H01L 33/62 | (2010.01) |
| H03K 17/78 | (2006.01) |
| H01L 25/16 | (2006.01) |
| H04B 10/80 | (2013.01) |
| H01L 31/12 | (2006.01) |

(52) U.S. Cl.
CPC .......... *H01L 31/147* (2013.01); *H01L 25/167* (2013.01); *H01L 31/12* (2013.01); *H03K 17/78* (2013.01); *H04B 10/802* (2013.01); *H01L 33/62* (2013.01)

(58) Field of Classification Search
CPC ..... H01L 31/147; H01L 31/14; H01L 25/167; H01L 25/162; H01L 33/62; H01L 33/48; H01L 33/52; H01L 31/12; H03K 17/78; H04B 10/802; H04B 10/801
See application file for complete search history.

(56) References Cited

U.S. PATENT DOCUMENTS

| 3,925,801 | A | * | 12/1975 | Haitz | .................. | H01L 27/0664 |
|---|---|---|---|---|---|---|
| | | | | | | 257/81 |
| 4,070,433 | A | * | 1/1978 | Miyoshi | .................. | H01B 3/30 |
| | | | | | | 264/216 |
| 4,179,619 | A | * | 12/1979 | Cook | .................... | H01L 31/167 |
| | | | | | | 250/239 |
| 4,271,365 | A | * | 6/1981 | Adams | .................... | H01L 31/16 |
| | | | | | | 250/551 |
| 4,450,461 | A | * | 5/1984 | Cook | .................. | G02B 6/4295 |
| | | | | | | 250/227.24 |
| 4,694,183 | A | * | 9/1987 | Merrick | ................ | H01L 31/167 |
| | | | | | | 250/551 |

(Continued)

*Primary Examiner* — John R Lee
(74) *Attorney, Agent, or Firm* — Li & Cai Intellectual Property (USA) Office

(57) ABSTRACT

An optocoupler device for receiving a load voltage larger than or equal to 5 KV includes a carrier, a supporting frame connected to the carrier, a light emitter and a light receiver spacedly mounted on the carrier, an electrical isolator at least partially disposed on the supporting frame, a translucent encapsulate, and an opaque encapsulate. The electrical isolator is translucent and has a dielectric strength larger than or equal to 50 KV/mm. A shortest light transmitting path between the light emitter and the light receiver passes through the electrical isolator. The supporting frame, the light emitter, the light receiver, and at least part of the electrical isolator are embedded in the translucent encapsulate, and the translucent encapsulate is embedded in the opaque encapsulate.

10 Claims, 6 Drawing Sheets

(56) References Cited

U.S. PATENT DOCUMENTS

| | | | | |
|---|---|---|---|---|
| 7,748,912 B2* | 7/2010 | Ho | H01L 31/125 | 385/92 |
| 8,346,033 B2* | 1/2013 | Kubota | H01L 25/167 | 385/14 |
| 8,853,658 B2* | 10/2014 | Maasi | H01L 31/173 | 250/551 |
| 9,279,946 B2* | 3/2016 | Tay | H01L 31/16 | |
| 9,685,578 B2* | 6/2017 | Chew | H01L 31/02325 | |
| 10,192,680 B2* | 1/2019 | Katzir | H01F 27/2804 | |
| 2005/0286840 A1* | 12/2005 | Ho | H01L 31/125 | 385/92 |
| 2007/0045800 A1* | 3/2007 | King | H01L 31/167 | 257/678 |
| 2008/0123250 A1* | 5/2008 | Tan | H01G 4/14 | 361/323 |
| 2008/0143191 A1* | 6/2008 | Laser | G04F 1/005 | 307/141 |
| 2011/0043871 A1* | 2/2011 | Okawa | G07D 7/121 | 358/474 |
| 2011/0235975 A1* | 9/2011 | Tay | G02B 6/4246 | 385/39 |
| 2012/0076455 A1* | 3/2012 | Siew | G02B 6/4246 | 385/14 |
| 2013/0313447 A1* | 11/2013 | Tay | H01L 31/0203 | 250/551 |
| 2014/0042344 A1* | 2/2014 | Maasi | H01L 31/173 | 250/551 |
| 2014/0117383 A1 | 5/2014 | Hsiao et al. | | |
| 2014/0119691 A1* | 5/2014 | Tay | H01L 31/02005 | 385/31 |
| 2014/0197338 A1* | 7/2014 | Guenter | H01S 5/183 | 250/551 |
| 2014/0212085 A1* | 7/2014 | Margaritis | H01L 24/11 | 385/14 |
| 2014/0374629 A1* | 12/2014 | Huang | H04B 10/802 | 250/551 |
| 2017/0200591 A1* | 7/2017 | Hill | H01J 37/32844 | |
| 2017/0338037 A1* | 11/2017 | Katzir | C25D 15/02 | |
| 2018/0309522 A1* | 10/2018 | Chiang | H01L 31/02327 | |
| 2019/0035966 A1* | 1/2019 | Hsiao | H01L 31/147 | |

\* cited by examiner

OPTOCOUPLER DEVICE AND FRAME MODULE THEREOF

BACKGROUND OF THE INVENTION

1. Field of the Invention

The present disclosure relates to a coupler; in particular, to an optocoupler device and a frame module thereof.

2. Description of Related Art

The conventional optocoupler device includes two lead frames, a light emitter and a light receiver respectively mounted on the two lead frames, and a translucent resin covering the light emitter and the light receiver. Specifically, light emitted from the light emitter can travel to the light receiver through the translucent resin.

However, in the conventional optocoupler device, a portion of the translucent resin arranged between the two lead frames easily generates a capacitance effect, so that the electrically isolating performance between the two lead frames is reduced to cause the conventional optocoupler device in an unstable state.

SUMMARY OF THE INVENTION

The present disclosure provides an optocoupler device and a frame module thereof to effectively improve the drawbacks associated with conventional optocoupler devices.

The present disclosure discloses an optocoupler device, which includes a first conductive frame, a second conductive frame, a supporting stand, a plurality of optical members, an electrical isolator, a translucent encapsulate, and an opaque encapsulate. The first conductive frame includes a first embedded portion, a first bonding portion extending from an edge of the first embedded portion, and a first exposing portion extending from the other edge of the first embedded portion. The second conductive frame includes a first embedded portion, a first bonding portion extending from an edge of the first embedded portion, and a first exposing portion extending from the other edge of the first embedded portion, wherein the second bonding portion is substantially coplanar with the first bonding portion. The supporting stand is connected to the first bonding portion. The optical members are respectively mounted on the first bonding portion and the second bonding portion. The optical members include a light emitter and a light receiver. The electrical isolator is translucent and has a dielectric strength larger than or equal to 50 KV/mm. At least part of the electrical isolator is fixed on the supporting stand, and a shortest light transmitting path between the light emitter and the light receiver passes through the electrical isolator. The first bonding portion, the second bonding portion, the supporting stand, the optical members, at least part of the electrical isolator are embedded in the translucent encapsulate. The first embedded portion, the second embedded portion, and the translucent encapsulate are embedded in the opaque encapsulate.

The present disclosure also discloses an optocoupler device for receiving a load voltage larger than or equal to 5 KV. The optocoupler device includes a carrier, a supporting stand, a light emitter and a light receiver, an electrical isolator, a translucent encapsulate, and an opaque encapsulate. The supporting stand is connected to the carrier. The light emitter and the light receiver are spacedly mounted on the carrier. The electrical isolator is translucent and has a dielectric strength larger than or equal to 50 KV/mm. At least part of the electrical isolator is fixed on the supporting stand, and a shortest light transmitting path between the light emitter and the light receiver passes through the electrical isolator. The supporting stand, the light emitter, the light receiver, and at least part of the electrical isolator are embedded in the translucent encapsulate. The translucent encapsulate is embedded in the opaque encapsulate.

The present disclosure further discloses a frame module of an optocoupler device. The frame module includes a conductive frame, a supporting stand, and an electrical isolator. The supporting stand is integrally formed on the conductive frame. The supporting stand has a communication space located at an inner side thereof. The electrical isolator is translucent and has a dielectric strength larger than or equal to 50 KV/mm. At least part of the electrical isolator is fixed on the supporting stand and shields the communication space.

In summary, the supporting stand is connected to the carrier (e.g., the conductive frame or the first conductive frame), and the electrical isolator fixed on the support stand and having a dielectric strength larger than or equal to 50 KV/mm is arranged in the shortest light transmitting path between the light emitter and the light receiver (or the electrical isolator shields the communication space of the supporting stand), so that the optocoupler device in the present disclosure can be provided with a better electrically isolating performance.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 6, which illustrate the present disclosure. References are hereunder made to the detailed descriptions and appended drawings in connection with the present disclosure. However, the appended drawings are merely provided for exemplary purposes, and should not be construed as restricting the scope of the present disclosure.

First Embodiment

Figure 1:
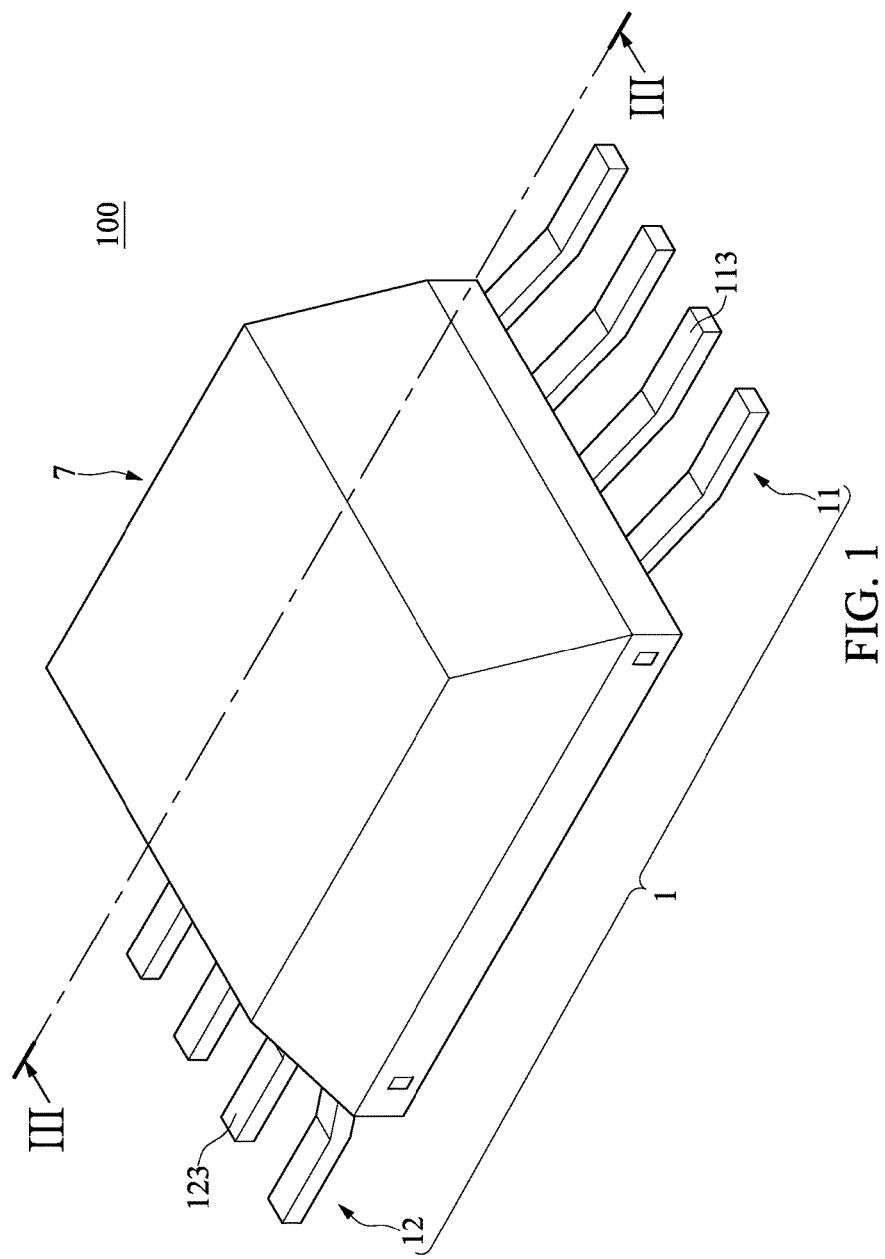
FIG. 1 is a perspective view showing an optocoupler device according to a first embodiment of the present disclosure.
Figure 2:
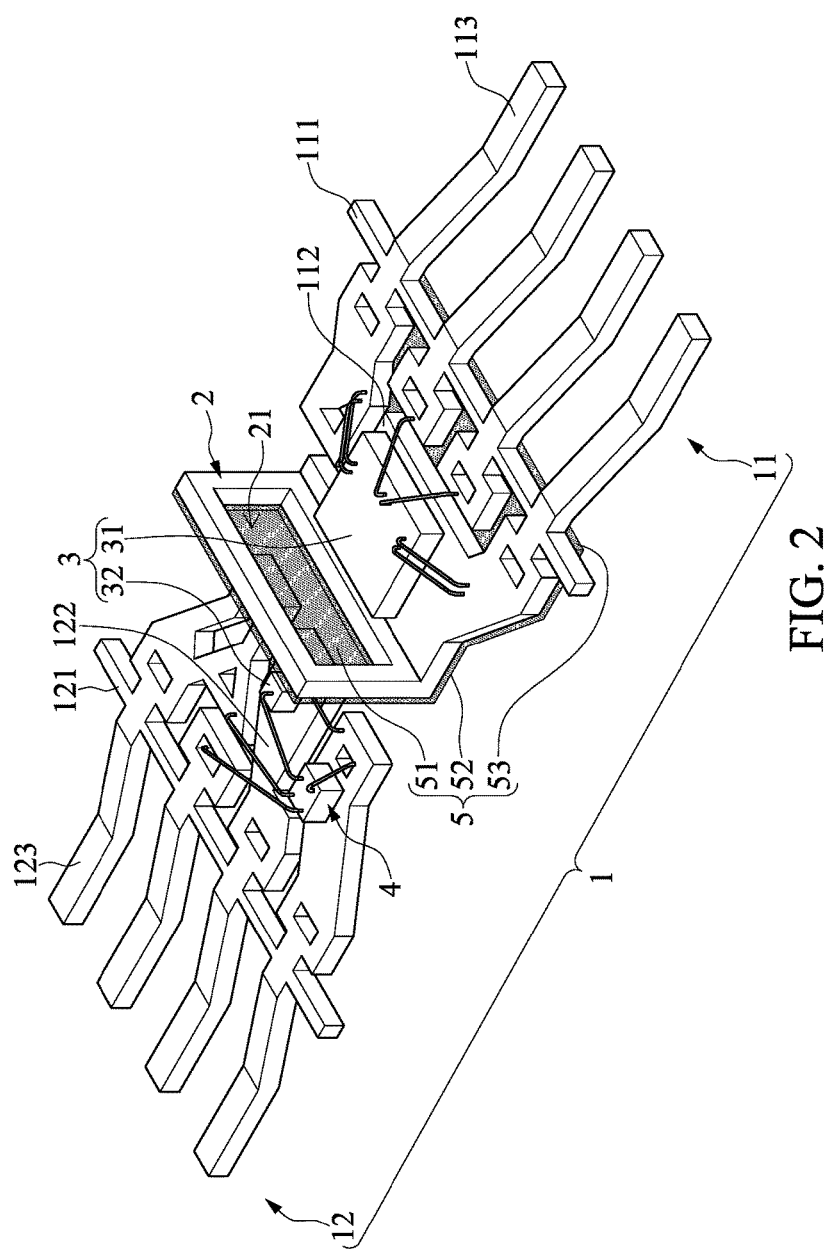
FIG. 2 is a perspective view showing the optocoupler device of FIG. 1 when a translucent encapsulate and an opaque encapsulate are omitted.
Figure 3:
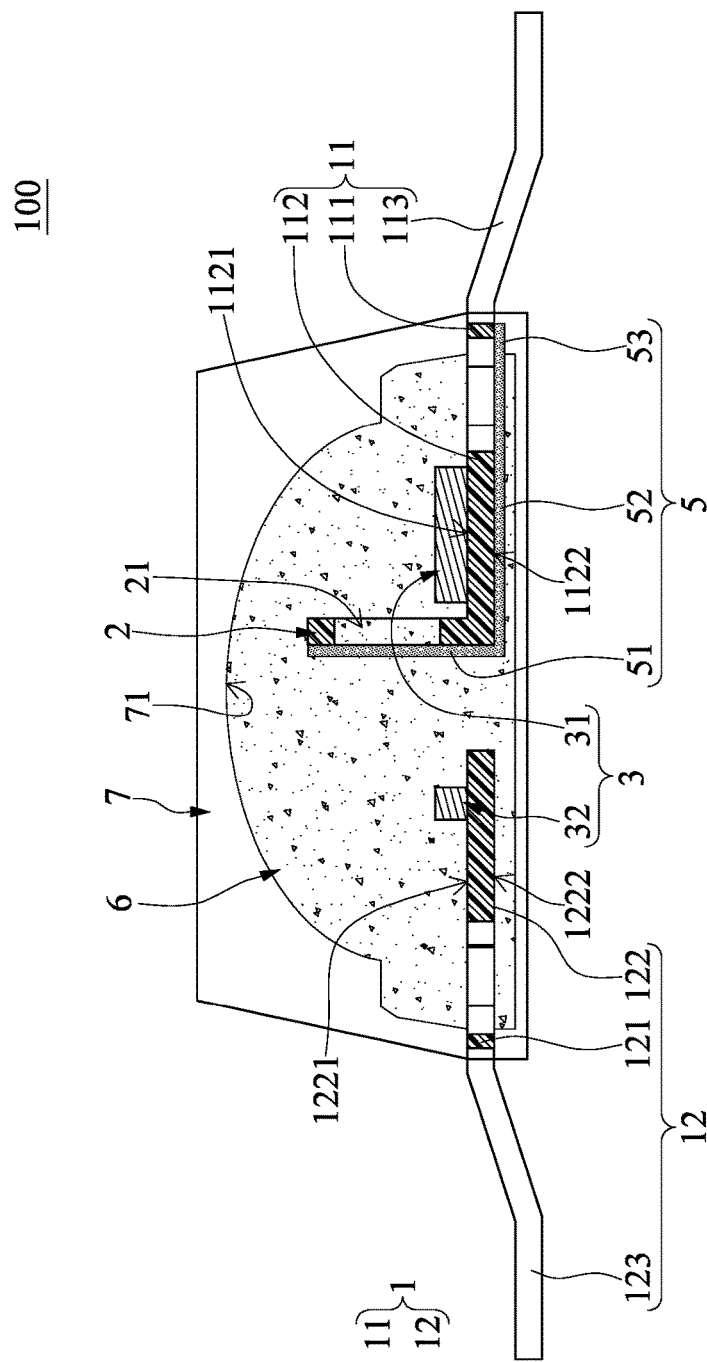
FIG. 3 is a cross-sectional view taken along a cross-sectional line of FIG. 1.

Reference is first made to FIGS. 1 to 3, which illustrate an optocoupler device 100 of a first embodiment. The optocoupler device 100 in the present embodiment is preferably in a side-by-side mode, and excludes a face-to-face mode. In other words, the optocoupler device 100 in the present disclosure can be in any mode excluding the face-to-face mode.

The optocoupler device 100 includes a carrier 1, a supporting stand 2, a plurality of optical members 3, a driving member 4, an electrical isolator 5, a translucent encapsulate 6, and an opaque encapsulate 7. The supporting stand 2 is connected to the carrier 1. The optical members 3 and the driving member 4 are spacedly mounted on the carrier 1. At least part of the electrical isolator 5 is fixed on the supporting stand 2. Moreover, the supporting stand 2, the optical members 3, the driving member 4, and at least part of the electrical isolator 5 are embedded in the translucent encapsulate 6. The translucent encapsulate 6 is embedded in the opaque encapsulate 7. The following description discloses the structure and connection of each component of the optocoupler device 100.

The carrier 1 in the present embodiment includes a first conductive frame 11 and a second conductive frame 12 spacedly arranged at one side of the first conductive frame 11. The first conductive frame 11 and the second conductive frame 12 have the same thickness, and the outer contour of the first conductive frame 11 is substantially identical to that of the second conductive frame 12, but the present disclosure is not limited thereto.

The first conductive frame 11 in the present embodiment is integrally formed as one piece and includes a first embedded portion 111, a first bonding portion 112 extending from an edge of the first embedded portion 111 (i.e., the left edge of the first embedded portion 111 as shown in FIG. 3), and a first exposing portion 113 extending from the other edge of the first embedded portion 111 (i.e., the right edge of the first embedded portion 111 as shown in FIG. 3). It should be noted that each of the first embedded portion 111, the first bonding portion 112, and the first exposing portion 113 has at least one metallic segment. For example, as shown in FIG. 2, the first embedded portion 111 in the present embodiment is one metallic segment, and the first bonding portion 112 and the first exposing portion 113 each have four metallic segments.

Specifically, the first embedded portion 111 and the first bonding portion 112 are substantially coplanar with each other, and the first exposing portion 113 is bent with respect to the first embedded portion 111. The first bonding portion 112 includes a first surface 1121 and an opposite second surface 1122, and the first embedded portion 111 has two slicing surfaces arranged on two opposite ends thereof.

The second conductive frame 12 in the present embodiment is integrally formed as one piece and includes a second embedded portion 121, a second bonding portion 122 extending from an edge of the second embedded portion 121 (i.e., the right edge of the second embedded portion 121 as shown in FIG. 3), and a second exposing portion 123 extending from the other edge of the second embedded portion 121 (i.e., the left edge of the second embedded portion 121 as shown in FIG. 3). It should be noted that each of the second embedded portion 121, the second bonding portion 122, and the second exposing portion 123 has at least one metallic segment. For example, as shown in FIG. 2, the second embedded portion 121 in the present embodiment is one metallic segment, and the second bonding portion 122 and the second exposing portion 123 each have four metallic segments.

Specifically, the second embedded portion 121 and the second bonding portion 122 are substantially coplanar with each other, and the second exposing portion 123 is bent with respect to the second embedded portion 121. The second bonding portion 122 includes a third surface 1221 and an opposite fourth surface 1222, and the second embedded portion 121 has two slicing surfaces arranged on two opposite ends thereof.

Moreover, the first bonding portion 112 and the second bonding portion 122 are substantially coplanar with each other. An end of the first bonding portion 112 away from the first exposing portion 113 faces and is arranged adjacent to an end of the second bonding portion 122 away from the second exposing portion 123. Specifically, the first surface 1121 of the first bonding portion 112 is coplanar with the third surface 1221 of the second bonding portion 122, and the second surface 1122 of the first bonding portion 112 is coplanar with the fourth surface 1222 of the second bonding portion 122.

In addition, free ends of the first exposing portion 113 and free ends of the second exposing portion 123 are arranged away from each other and are substantially coplanar with each other for being mounted on a carrier (e.g., a circuit board). The first exposing portion 113 and the second exposing portion 123 of the optocoupler device 100 are configured to connect to a load voltage larger than or equal to 5 KV, but the present disclosure is not limited thereto.

The supporting stand 2 in the present embodiment is a rectangular (or square) annular shape, that is to say, the supporting stand 2 has a communication space 21 located at an inner side thereof, but the present disclosure is not limited thereto. Specifically, the supporting stand 2 is connected to the first bonding portion 112 of the first conductive frame 11, and the supporting stand 2 in the present embodiment is integrally and perpendicularly connected to the end of the first bonding portion 112 (i.e., the left end of the first surface 1121 of the first bonding portion 112 arranged away from the first exposing portion 113). That is to say, the supporting stand 2 and the first conductive frame 11 in the present embodiment are made of the same material and are integrally formed as one piece, and the supporting stand 2 is bent with respect to the first bonding portion 112, but the present disclosure is not limited thereto.

The optical members 3 are respectively mounted on (the first surface 1121 of) the first bonding portion 112 of the first conductive frame 11 and (the third surface 1221 of) the second bonding portion 122 of the second conductive frame 12. The optical members 3 in the present embodiment includes a light emitter 32 and a light receiver 31 configured to receive light emitted from the light emitter 32. In other embodiments of the present disclosure, the number of the light receiver 31 or the number of the light emitter 32 in the optocoupler device 100 can be more than one.

Specifically, the light receiver 31 in the present embodiment is a photodiode, a photo transistor, or a photo IC, and the light emitter 32 is an LED chip, but the present disclosure is not limited thereto.

Moreover, the light receiver 31 is mounted on the first bonding portion 112. Specifically, the light receiver 31 is fixed on the first surface 1121 of the first bonding portion 112 by using a silver adhesive, and is electrically connected to the first bonding portion 112 by wiring. The light emitter 32 is mounted on the second bonding portion 122. Specifically, the light emitter 32 is fixed on the third surface 1221 of the second bonding portion 122 by using a silver adhesive, and is electrically connected to the second bonding portion 122 by wiring.

The driving member 4 is mounted on (the third surface 1221 of) the second bonding portion 122, and the driving member 4 and the light emitter 32 are respectively fixed on two different metallic segments of the second bonding portions 122. The driving member 4 is configured to activate the light emitter 32 to emit light, which travels to the light receiver 31 through the translucent encapsulate 6, and the light emitter 32 and the light receiver 31 have a plurality of light transmitting paths there-between.

The electrical isolator 5 is translucent and has a dielectric strength larger than or equal to 50 KV/mm. The electrical isolator 5 in the present embodiment is preferably a transparent film and is made of polymide (PI) having a dielectric strength within a range of 100~300 KV/mm, but the present disclosure is not limited thereto. At least part of the electrical isolator 5 is fixed on the supporting stand 2 and shields the communication space 21 of the supporting stand 2, so that a shortest transmitting path between the light emitter 32 and the light receiver 31 passes through the electrical isolator 5 and the communication space 21.

The electrical isolator 5 includes an electrically isolating portion 51, a holding portion 52 connected to the electrically isolating portion 51, and a protruding portion 53 connected to the holding portion 52 and arranged away from the electrically isolating portion 51. The electrical isolator 5 is fixed on the supporting stand 2 and the second surface 1122 of the first bonding portion 112. Specifically, the electrically isolating portion 51 is adhered to the supporting stand 2, and the holding portion 52 is adhered to the second surface 1122 of the first bonding portion 112, so that the protruding portion 53 is arranged away from the supporting stand 2. The electrically isolating portion 51 is preferably adhered to a surface of the supporting stand 2 (i.e., the left surface of the supporting stand 2 as shown in FIG. 3) away from the first exposing portion 113, thereby entirely shielding the communication space 21, but the present disclosure is not limited thereto.

The translucent encapsulate 6 in the present embodiment is preferably transparent and is made of an epoxy resin, but the present disclosure is not limited thereto. The first bonding portion 112, the second bonding portion 122, the supporting stand 2, the optical members 3, at least part of the electrical isolator 5 (i.e., the electrically isolating portion 51 and the holding portion 52) are embedded in the translucent encapsulate 6.

Moreover, the opaque encapsulate 7 in the present embodiment preferably have a white color for having a better light reflecting effect, and is made of an epoxy resin, but the present disclosure is not limited thereto. The first embedded portion 111, the second embedded portion 121, the translucent encapsulate 6, and part of the electrical isolator 5 (i.e., the protruding portion 53) are embedded in the opaque encapsulate 7.

Specifically, the opaque encapsulate 7 has a reflecting surface 71, and the light emitter 32 and the light receiver 31 are preferably arranged to face the reflecting surface 71. In a cross-section of the light emitter 32, the light receiver 31, and the reflecting surface 71 (as shown in FIG. 3), the reflecting surface 71 is in an ellipse shape having two focal points, and the light emitter 32 and the light receiver 31 are preferably and respectively located at the two focal points, so that light emitted from the light emitter 32 can be reflected to the light receiver 31 by the reflecting surface 71.

Moreover, the supporting stand 2 and the electrical isolator 5 do not contact the reflecting surface 71 of the opaque encapsulate 7, and the protruding portion 53 of the electrical isolator 5 protrudes from the translucent encapsulate 6 and is embedded in the opaque encapsulate 7, so that the electrical isolator 5 can be accurately and firmly embedded in the translucent encapsulate 6 and the opaque encapsulate 7. In other embodiments of the present disclosure, the electrical isolator 5 can be formed without the protruding portion 53.

In other embodiments of the present disclosure, the refractive index of the electrical isolator 5 can be different from that of the translucent encapsulate 6, such that when light emitted from the light emitter 32 passes through the electrically isolating portion 51, the electrically isolating portion 51 of the electrical isolator 5 can refract the light toward the light receiver 31, thereby reducing the light transmitting path between the light emitter 32 and the light receiver 31.

In addition, the first conductive frame 11 can be named as a conductive frame 11. As shown in FIG. 2, the conductive frame 11, the supporting stand 2 integrally and perpendicularly connected to the conductive frame 11, and the electrical isolator 5 in the present embodiment can be co-defined as a frame module. In practical use, the frame module of the present disclosure can be applied to different devices, and is not limited to the present embodiment.

Second Embodiment

Figure 4:
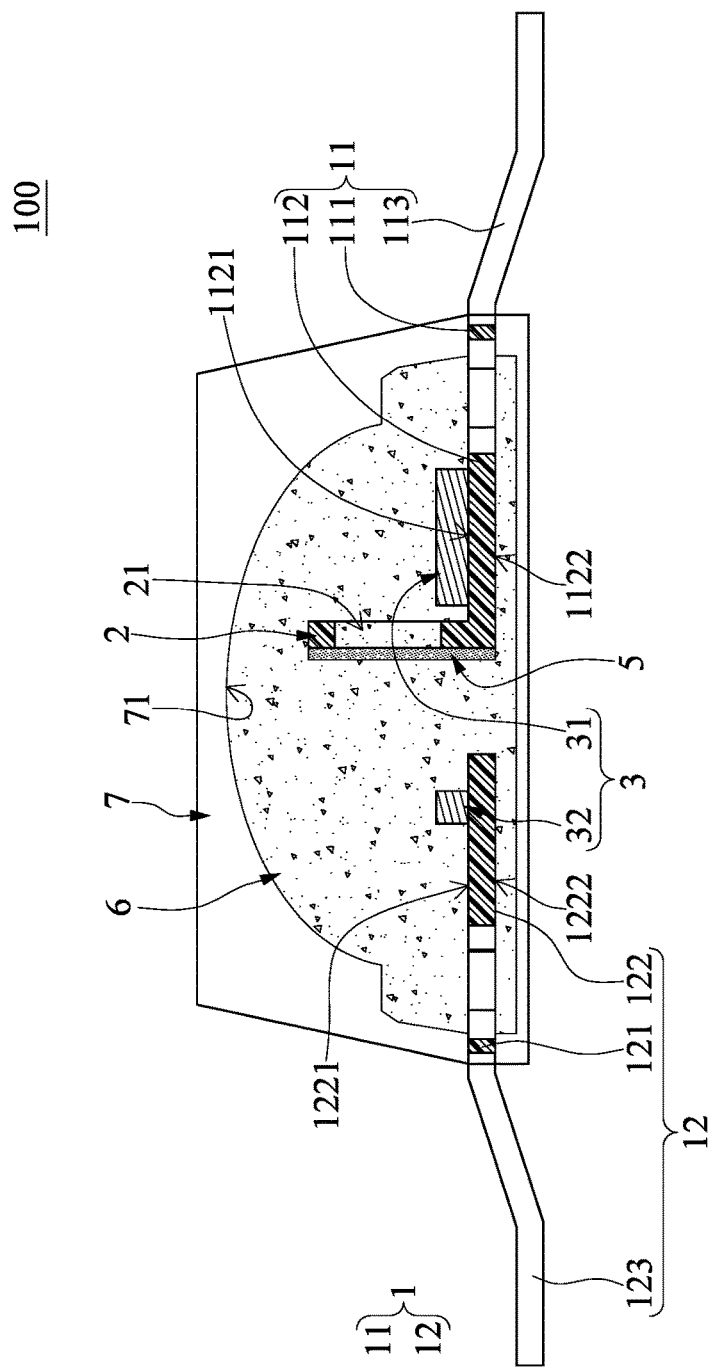
FIG. 4 is a cross-sectional view showing the optocoupler device according to a second embodiment of the present disclosure.

Reference is made to FIG. 4, which illustrates a second embodiment of the present disclosure. The second embodiment is similar to the first embodiment, and the difference between the two embodiments is disclosed as follows. The electrical isolator 5 in the present embodiment only has the electrically isolating portion 51 as disclosed in the first embodiment, that is to say, the electrical isolator 5 in the present embodiment is only adhered to the supporting stand 2.

Third Embodiment

Figure 5:
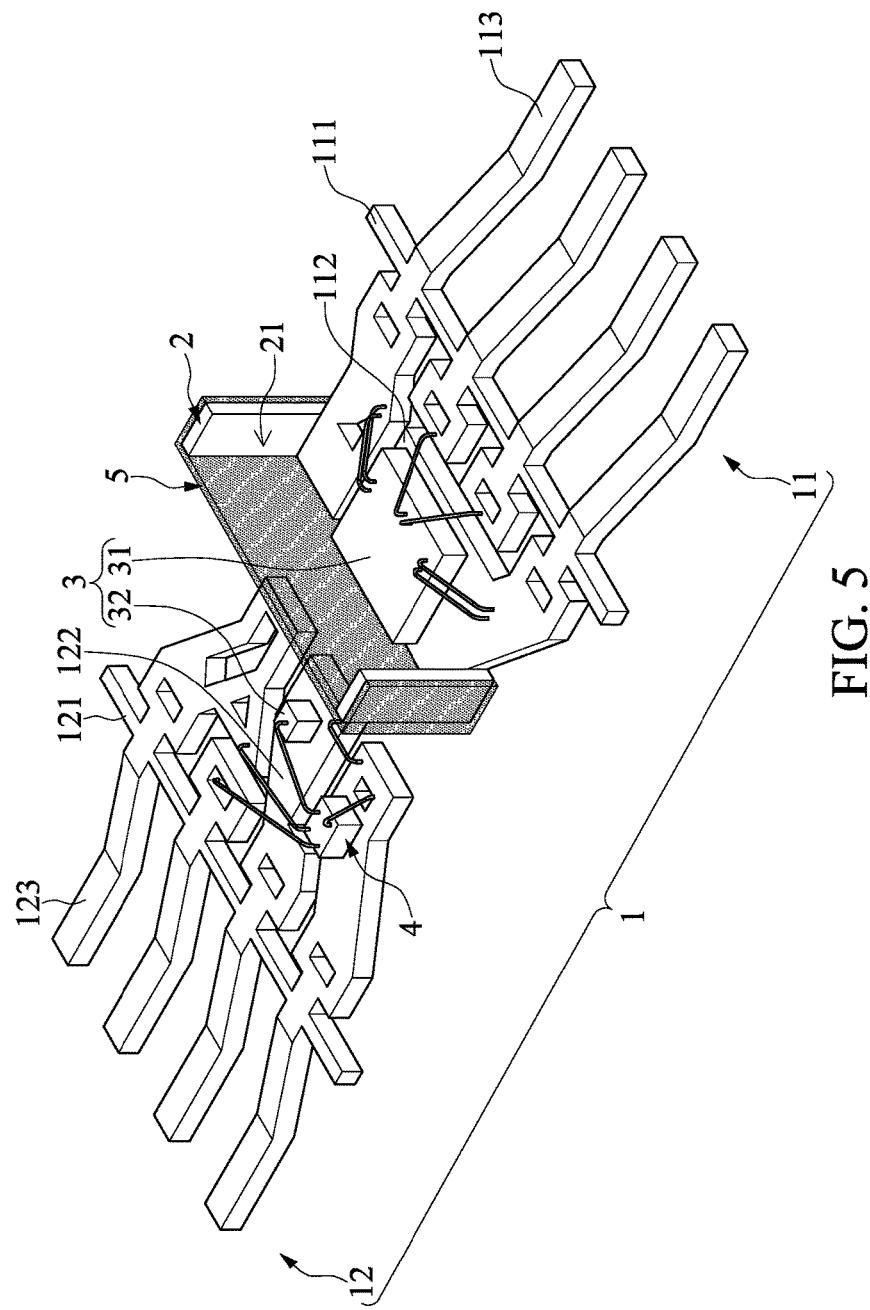
FIG. 5 is a perspective view showing the optocoupler device according to a third embodiment of the present disclosure when the translucent encapsulate and the opaque encapsulate are omitted.

Reference is made to FIG. 5, which illustrates a third embodiment of the present disclosure. The third embodiment is similar to the first and second embodiments, and the difference between the embodiments is disclosed as follows. The supporting stand 2 in the present embodiment includes two pillars respectively connected to two opposite edges of the first bonding portion 112. That is to say, the light emitter 32 and the light receiver 31 are separated by the electrical isolator 5, and the supporting stand 2 is not arranged between the light emitter 32 and the light receiver 31.

Third Embodiment

Figure 6:
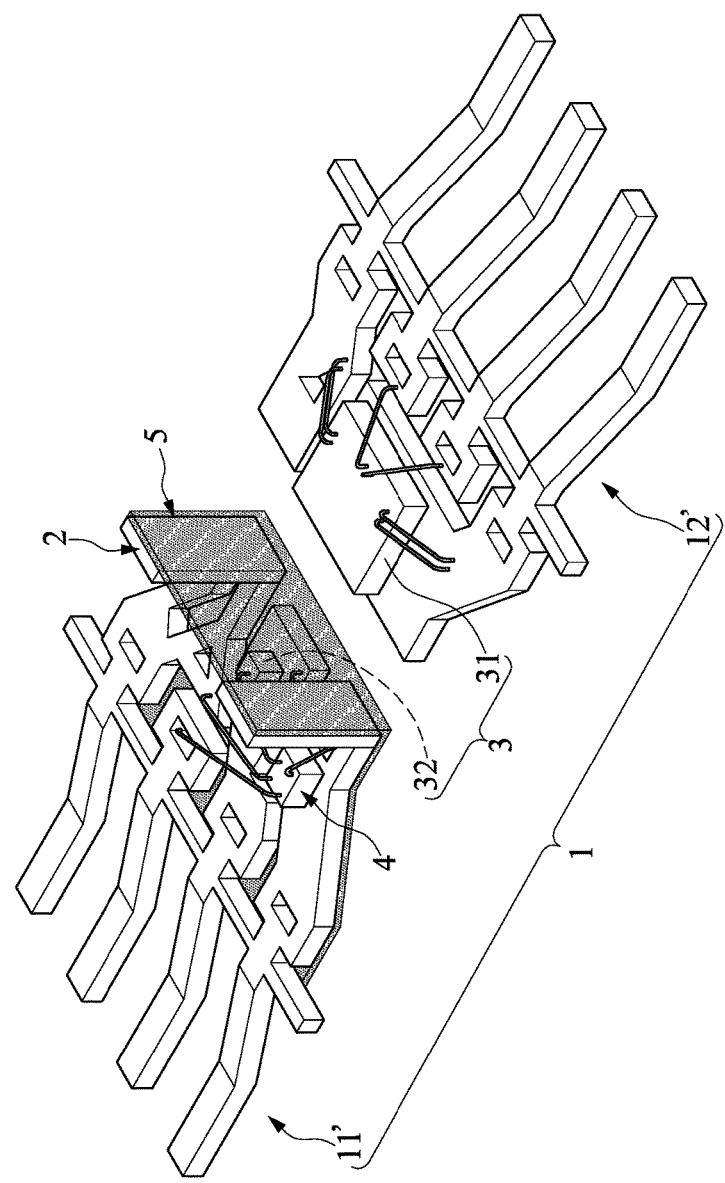
FIG. 6 is a perspective view showing the optocoupler device according to a fourth embodiment of the present disclosure when the translucent encapsulate and the opaque encapsulate are omitted.

Reference is made to FIG. 6, which illustrates a fourth embodiment of the present disclosure. The fourth embodiment is similar to the first, second, and third embodiments, and the difference between the embodiments is disclosed as follows. The first conductive frame 11' in the present embodiment is the second conductive frame 12 as disclosed in the first embodiment, and the second conductive frame 12' in the present embodiment is the first conductive frame 11 as disclosed in the first embodiment.

In other words, the structure of the first conductive frame 11' in the present embodiment is identical to that of the second conductive frame 12 as disclosed in the first embodiment, and the structure of the second conductive frame 12 in the present embodiment is identical to that of the first conductive frame 11 as disclosed in the first embodiment. Thus, the supporting stand 2, the light emitter 32, and the driving member 4 in the present embodiment are connected to the first conductive frame 11', and the electrical isolator 5 is arranged adjacent to the light emitter 32.

The Effects of the Above Embodiments

In summary, the supporting stand is connected to the conductive frame (i.e., the first conductive frame), and the electrical isolator fixed on the support stand and having a dielectric strength larger than or equal to 50 KV/mm is arranged in the shortest light transmitting path between the light emitter and the light receiver (or the electrical isolator shields the communication space of the supporting stand), so that the optocoupler device can be provided with a better electrically isolating performance.

Moreover, the first conductive frame and the supporting stand are integrally formed as one piece, so that the optocoupler device of the present disclosure can be made of the conventional manufacturing process for being rapidly promoted and produced. In addition, the electrically isolating portion and the holding portion of the electrical isolator are embedded in the translucent encapsulate, and the protruding portion of the electrical isolator protrudes from the translucent encapsulate and is embedded in the opaque encapsulate, so that the electrical isolator can be accurately and firmly embedded in the translucent encapsulate and the opaque encapsulate.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An optocoupler device, comprising:
   a first conductive frame including a first embedded portion, a first bonding portion extending from an edge of the first embedded portion, and a first exposing portion extending from the other edge of the first embedded portion, wherein the first bonding portion has a first surface and a second surface opposite to the first surface;
   a second conductive frame including a second embedded portion, a second bonding portion extending from an edge of the second embedded portion, and a second exposing portion extending from the other edge of the second embedded portion, wherein the second bonding portion is substantially coplanar with the first bonding portion;
   a supporting stand connected to the first bonding portion and having a communication space located at an inner side thereof, wherein the supporting stand and the first conductive frame are integrally formed as one piece, and the supporting stand is perpendicularly bent with respect to the first bonding portion and is arranged away from the first exposing portion;
   a plurality of optical members respectively mounted on the first surface of the first bonding portion and the second bonding portion, wherein the optical members include a light emitter and a light receiver, and a height of each of the optical members with respect to the first conductive frame is lower than a height of the supporting stand with respect to the first conductive frame;
   an L-shaped electrical isolator being translucent and having a dielectric strength larger than or equal to 50 KV/mm, wherein at least part of the electrical isolator is fixed on the second surface and the supporting stand, and shields the communication space, and wherein a shortest light transmitting path between the light emitter and the light receiver passes through a portion of the electrical isolator fixed on the supporting stand, and passes through the communication space;
   a translucent encapsulate, wherein the first bonding portion, the second bonding portion, the supporting stand, the optical members, at least part of the electrical isolator are embedded in the translucent encapsulate; and
   an opaque encapsulate, wherein the first embedded portion, the second embedded portion, and the translucent encapsulate are embedded in the opaque encapsulate.

2. The optocoupler device as claimed in claim 1, wherein the electrical isolator includes a protruding portion arranged away from the supporting stand, the protruding portion is connected to a portion of the electrical isolator fixed on the second surface, and the protruding portion protrudes from the translucent encapsulate and is embedded in the opaque encapsulate.

3. The optocoupler device as claimed in claim 1, wherein the opaque encapsulate has a reflecting surface; in a cross-section of the light emitter, the light receiver, and the reflecting surface, the reflecting surface is in an ellipse shape having two focal points, and the light emitter and the light receiver are respectively located at the two focal points.

4. The optocoupler device as claimed in claim 3, wherein at least part of the electrical isolator is adhered to the supporting stand, and the electrical isolator does not contact the reflecting surface of the opaque encapsulate.

5. The optocoupler device as claimed in claim 1, further comprising a driving member configured to activate the light emitter to emit light, wherein the driving member and the light emitter are mounted on the second bonding portion, and the light receiver is mounted on the first bonding portion.

6. The optocoupler device as claimed in claim 1, wherein the first exposing portion and the second exposing portion of the optocoupler device are configured to connect to a load voltage larger than or equal to 5 KV.

7. An optocoupler device for receiving a load voltage larger than or equal to 5 KV, comprising:
   a carrier;
   a supporting stand perpendicularly connected to the carrier, wherein the supporting stand has a communication space located at an inner side thereof;
   a light emitter and a light receiver spacedly mounted on the carrier, wherein a height of each of the light emitter and the light receiver with respect to the carrier is lower than a height of the supporting stand with respect to the carrier;
   an electrical isolator being translucent and having a dielectric strength larger than or equal to 50 KV/mm, wherein at least part of the electrical isolator is fixed on the supporting stand and shields the communication space, and a shortest light transmitting path between the light emitter and the light receiver passes through the electrical isolator of the communication space;

a translucent encapsulate, wherein the supporting stand, the light emitter, the light receiver, and at least part of the electrical isolator are embedded in the translucent encapsulate; and an opaque encapsulate, wherein the translucent encapsulate is embedded in the opaque encapsulate.

8. The optocoupler device as claimed in claim 7, wherein the opaque encapsulate has a reflecting surface; in a cross-section of the light emitter, the light receiver, and the reflecting surface, the reflecting surface is in an ellipse shape having two focal points, and the light emitter and the light receiver are respectively located at the two focal points.

9. The optocoupler device as claimed in claim 8, wherein at least part of the electrical isolator is adhered to the supporting stand, and the electrical isolator does not contact the reflecting surface of the opaque encapsulate.

10. A frame module of an optocoupler device, comprising:
a conductive frame having a first surface and a second surface opposite to the first surface;
a supporting stand integrally formed on the conductive frame, wherein the supporting stand is perpendicularly bent with respect to the first conductive frame, and the supporting stand has a communication space located at an inner side thereof; and
an L-shaped electrical isolator being translucent and having a dielectric strength larger than or equal to 50 KV/mm, wherein at least part of the electrical isolator is fixed on the second surface and the supporting stand and shields the communication space.

* * * * *